US009638587B2

(12) United States Patent
Marquas et al.

(10) Patent No.: US 9,638,587 B2
(45) Date of Patent: May 2, 2017

(54) CAPACITIVE SENSOR FOR DETECTING THE MOVEMENT OF AN OBJECT

(71) Applicant: Behr-Hella Thermocontrol GmbH, Stuttgart (DE)

(72) Inventors: Karsten Marquas, Arnsberg (DE); Michael Steinkamp, Lippstadt (DE); Dirk Schluter, Lippstadt (DE)

(73) Assignee: Behr-Hella Thermocontrol GmbH, Stuttgart (DE)

( * ) Notice: Subject to any disclaimer, the term of this patent is extended or adjusted under 35 U.S.C. 154(b) by 0 days.

(21) Appl. No.: 14/409,547

(22) PCT Filed: Jun. 12, 2013

(86) PCT No.: PCT/EP2013/062157
§ 371 (c)(1),
(2) Date: Dec. 19, 2014

(87) PCT Pub. No.: WO2013/189807
PCT Pub. Date: Dec. 27, 2013

(65) Prior Publication Data
US 2015/0341031 A1    Nov. 26, 2015

(30) Foreign Application Priority Data
Jun. 19, 2012    (DE) .......................... 10 2012 210 277

(51) Int. Cl.
*G01L 1/00*    (2006.01)
*G01L 1/14*    (2006.01)
(Continued)

(52) U.S. Cl.
CPC ............ *G01L 1/142* (2013.01); *G01D 5/2417* (2013.01); *G06F 3/0338* (2013.01); *H01G 5/013* (2013.01);
(Continued)

(58) Field of Classification Search
CPC .. G01D 5/2417; G01D 5/2412; G06F 3/0338; G06F 3/044; G06F 2203/04103;
(Continued)

(56) References Cited

U.S. PATENT DOCUMENTS 5,206,785 A    4/1993   Hukashima
7,307,827 B2 *  12/2007  Shimanouchi ........... H01G 5/18
                                                       361/278
(Continued)

FOREIGN PATENT DOCUMENTS

DE    10 2007 001086 A1    8/2007
EP     1 698 876 A2         9/2006
(Continued)

OTHER PUBLICATIONS

International Search Report and Written Opinion for corresponding patent application No. PCT/EP2013/062157 dated Sep. 23, 2013.

*Primary Examiner* — Harshad R Patel
*Assistant Examiner* — Brandi Hopkins
(74) *Attorney, Agent, or Firm* — Renner, Otto, Boisselle & Sklar, LLP

(57) ABSTRACT

A capacitive sensor for detecting the movement of an object, such as actuation of a key of an operating unit, includes first and second electrodes that are provided for connection or mechanical coupling to or arrangement on the object, the distance of which second electrode from the first electrode changes when the object moves. The electrodes form a first capacitor with a volume between the electrodes, the size of which changes when the object moves. An evaluation unit determines a change of capacitance between the two electrodes resulting from a change of their spacing and volume. A deformable, non-gaseous first dielectric is arranged between the electrodes and defines at least one gas volume that is filled by a gaseous second dielectric that can escape (Continued)

from the gas volume when the two electrodes approach one another.

9 Claims, 2 Drawing Sheets

(51) Int. Cl.
  *G01D 5/241* (2006.01)
  *G06F 3/0338* (2013.01)
  *H01G 5/013* (2006.01)
  *H03K 17/975* (2006.01)
(52) U.S. Cl.
  CPC ......... *H01G 5/0136* (2013.01); *H03K 17/975* (2013.01)
(58) Field of Classification Search
  CPC .... H01G 5/013; H01G 5/0136; H03K 17/975; G01L 5/228; G01L 1/142; G01L 1/146; G01B 7/22; A61B 5/11; G01G 7/06; G01G 19/4142; B60R 21/01532
  USPC ............. 73/780, 862.626; 340/657; 324/686; 29/25.03
  See application file for complete search history.

(56) References Cited

U.S. PATENT DOCUMENTS

| | | |
|---|---|---|
| 2007/0180923 A1 | 8/2007 | Liu et al. |
| 2008/0202251 A1 | 8/2008 | Serban et al. |
| 2009/0273483 A1* | 11/2009 | Tompkins ............... G01L 1/142 340/657 |
| 2010/0033196 A1* | 2/2010 | Hayakawa ............... G01B 7/22 324/686 |

FOREIGN PATENT DOCUMENTS

| | | |
|---|---|---|
| EP | 1 261 845 B1 | 8/2008 |
| EP | 2 154 503 A2 | 2/2010 |

* cited by examiner

CAPACITIVE SENSOR FOR DETECTING THE MOVEMENT OF AN OBJECT

The invention relates to a capacitive sensor for detecting the movement of an object, with the object being particularly a manually operable key of an operating unit provided particularly for a vehicle component such as e.g. an air-conditioning control device, an infotainment device, a navigation device, a radio or generally a man-machine interface.

BACKGROUND

In most cases, the detection of the movement of an object in the form of a manually operable key of which the operation is to be detected, will be performed by mechanical switches comprising a switching element that is mechanically coupled to the key. Thus, when the key is operated, the switching element will be operated and the switching element in turn will establish a switching contact signaling the operation of the key. By way of alternative to such mechanical approaches, there also exist capacitive systems wherein the movement of an object is detected on the basis of a change of capacitance. Thus, referring to the example of a key of an operating element, actuation of the key will result e.g. in a change of the distance between two electrodes of the capacitor of a capacitive sensor, which can be evaluated with the aid of signal processing technology. To make it possible for the two electrodes to perform a relative movement, the volume between the two electrodes must be compressible and expandable, respectively. As a dielectric in this respect, gas or particularly air are suitable. In this regard, it is, however, disadvantageous that air, or gas in general, merely has a relatively low dielectric constant so that changes of capacitance caused by a change of the distance between the two electrodes will effect only small signal changes.

Diverse designs of capacitive sensors wherein use is made of changes of the electric coupling of the electrodes as are caused as a result of an effective force, are described in DE 10 2007 001 086 A1, EP 1 261 845 B1 (as well as U.S. Pat. No. 6,683,780 B2) and U.S. Pat. No. 5,206,785. In the sensor according to DE 10 2007 001 086 A1, use is made of a fixed dielectric, with an electrically conductive, flexible layer arranged at a distance therefrom. When a pressure is applied, a plunger will act on this layer and will move it toward the dielectric and into a more or less large surface contact with the dielectric, thus effecting the desired signal variation of the outputs signal of the sensor. Also in the sensor according to U.S. Pat. No. 5,206,785, a fixed dielectric is used. In EP 1 261 845 B1 and EUS 6 683 780 B2, a capacitive differential sensor with air as a dielectric is described.

SUMMARY OF THE INVENTION

The invention provides a capacitive sensor for detecting the movement of an object, which sensor shall generate measurement signal changes that are easily detectable and thus sufficiently large also in case of small movements.

The invention proposes a capacitive sensor for detecting the movement of an object, particularly for detecting the operation of a key of an operating unit, which capacitive sensor comprises a first electrode, a second electrode provided for connection or mechanical coupling to, or for arrangement on, the object, the distance of the second electrode from the first electrode changing when the object moves, the two electrodes forming a first capacitor with a volume between the electrodes, the size of which changes when the object moves, and an evaluation unit connected to the two electrodes and operative to determine a change of capacitance between the two electrodes resulting from a change of their spacing and volume. A deformable, non-gaseous first dielectric is arranged between the two electrodes, the first dielectric defines at least one gas volume or, together with at least one of the two electrodes defines a gas volume, said gas volume being filled by a gaseous second dielectric, at least a part of the second dielectric escaping from the gas volume and from the volume between the two electrodes when the two electrodes approach one another, and, when the two electrodes approach one another, the portion of the volume between the two electrodes occupied by the first dielectric increases and the portion of the volume between the two electrodes occupied by the second dielectric decreases. Further features are described that relate to individual embodiments of the invention.

The capacitive sensor of the invention comprises a capacitor having a first and a second electrode with a volume therebetween. One of the two electrodes is connected to an object or is mechanically coupled thereto and respectively arranged thereon, so that the electrode will move when the object moves. Upon movement of the electrode, its distance to the other electrode will change. Thus, also the volume between the two electrodes will change. The volume between the two electrodes is to be understood as that area which is delimited, on the one hand, by the electrodes themselves and, further, laterally of the electrodes. The two electrodes are connected to an evaluation unit for detection of capacitance changes of the capacitor.

According to the invention, the volume between the two electrodes is at least partially filled by a deformable first dielectric which is not gaseous. A further part of the volume between the two electrodes is filled by gas. This gas volume can be formed by the first dielectric or can be formed between the first dielectric and one or both of the electrodes. The gas volume is filled by a gaseous second dielectric. Now, when the two electrodes approach one another, gaseous second dielectric will escape from the gas volume; conversely, an increase of the distance between the two electrodes could cause gaseous second dielectric to enter from the ambience into the gas volume. In case of a change of the distance between the two electrodes, there will thus occur a change, on the one hand, of the portion of the volume between the electrodes that is occupied by the first dielectric, and, on the other hand, of the portion occupied by the second dielectric. These changes of said portions will effect an amplification of the change of capacitance which will be detected with the aid of measurement technology, thus making it possible that also minor movements of the electrodes, and thus of the object, can be detected though measurement technology in a reliable manner and with low expenditure.

According to a preferred embodiment of the invention, two capacitors can be used in opposite senses for detecting the movement of an object. The appertaining arrangement is selected in such a manner that, upon occurrence of a movement of the object, the distance of the electrodes of one capacitor will decrease while the distance of the electrodes of the other capacitor will increase. Both capacitors are substantially identical in design, i.e. each comprise a non-gaseous first dielectric and a gaseous second dielectric. Effected thereby is a further increase of the measurement accuracy and, correspondingly, of the reliability of the detection of the movement of the object.

In this embodiment, it is specifically provided that a second capacitor is included which comprises a first electrode and a second electrode provided for connection or mechanical coupling to, or for arrangement on, the object, wherein, in case of a movement of the object, the distances between the electrodes of the two capacitors will change in opposite senses, wherein both capacitors comprise between them a non-gaseous first and a gaseous second dielectric, and wherein the electrodes of both capacitors are connected to the evaluation unit.

The gas volume of the first dielectric and respectively the gas volume between the first dielectric and at least one of the two electrodes is suitably realized in that the first dielectric comprises at least one recess, open toward the exterior, from which gas (i.e. second dielectric) can escape when the two electrodes approach one another. Alternatively, the surface of the first dielectric can be profiled and respectively structured, i.e. comprise receiving spaces for gas that are open toward the exterior. In any case, it must be safeguarded that the gas can escape from the gas volume filled by the second dielectric, also out of the intermediate space between the two electrodes.

According to an advantageous embodiment of the invention, it can be provided that the first dielectric is resilient. Thus, after deformation due to a change of the distance between the electrodes, the first dielectric will automatically assume its original shape again. In this regard, it is advantageous if the first dielectric is connected to the electrodes, particularly at their mutually confronting (inner) surfaces. The resiliency of the first dielectric makes it possible to use the first dielectric also for support of the object whose movement is to be detected. Further, a resilient first dielectric will effect an automatic transfer of the object into the rest position which the object assumed prior to a movement. Thus, in case that two capacitors are provided, as described above, the object is subjected to recovering forces directed in opposite senses from two opposite sides, which will transfer the object again into its rest position out of which it had been moved.

According to a further advantageous embodiment of the invention, it can be provided that the first dielectric is a shaped body formed in the manner of a lens and having two outer sides facing toward the electrodes and that said gas volume is formed between the outer sides and the electrodes.

As a material for the first dielectric, particularly an elastomer and preferably rubber are suitable. The first dielectric can be porous and open-celled, respectively. Of particular usefulness is a foamed material which is compressible to the effect that, while the gas is escaping, the open-celled gas volumes can be compressed toward the exterior when the two electrodes approach each other.

The invention further relates to an operating unit provided for a vehicle component, particularly for an air-conditioning control device, an infotainment device, a navigation device, a radio or generally a man-machine interface, said operating unit being provided with a manually operable, movable key, particularly a toggle key, a rocker key or a push button, and with a capacitive sensor for detection of a movement and thus of an actuation of the key, wherein the capacitive sensor can be designed according to one or a plurality of the claims.

The capacitive sensor of the invention, provided for detecting the movement of an object, can—as evident from the above—function as a force and respectively pressure sensor and/or as a displacement sensor, while, however, always being applied for detecting the movement of an object.

The invention will be explained in greater detail hereunder by way of two embodiments and with reference to the drawings. In the drawings,

DETAILED DESCRIPTION

Figure 1:
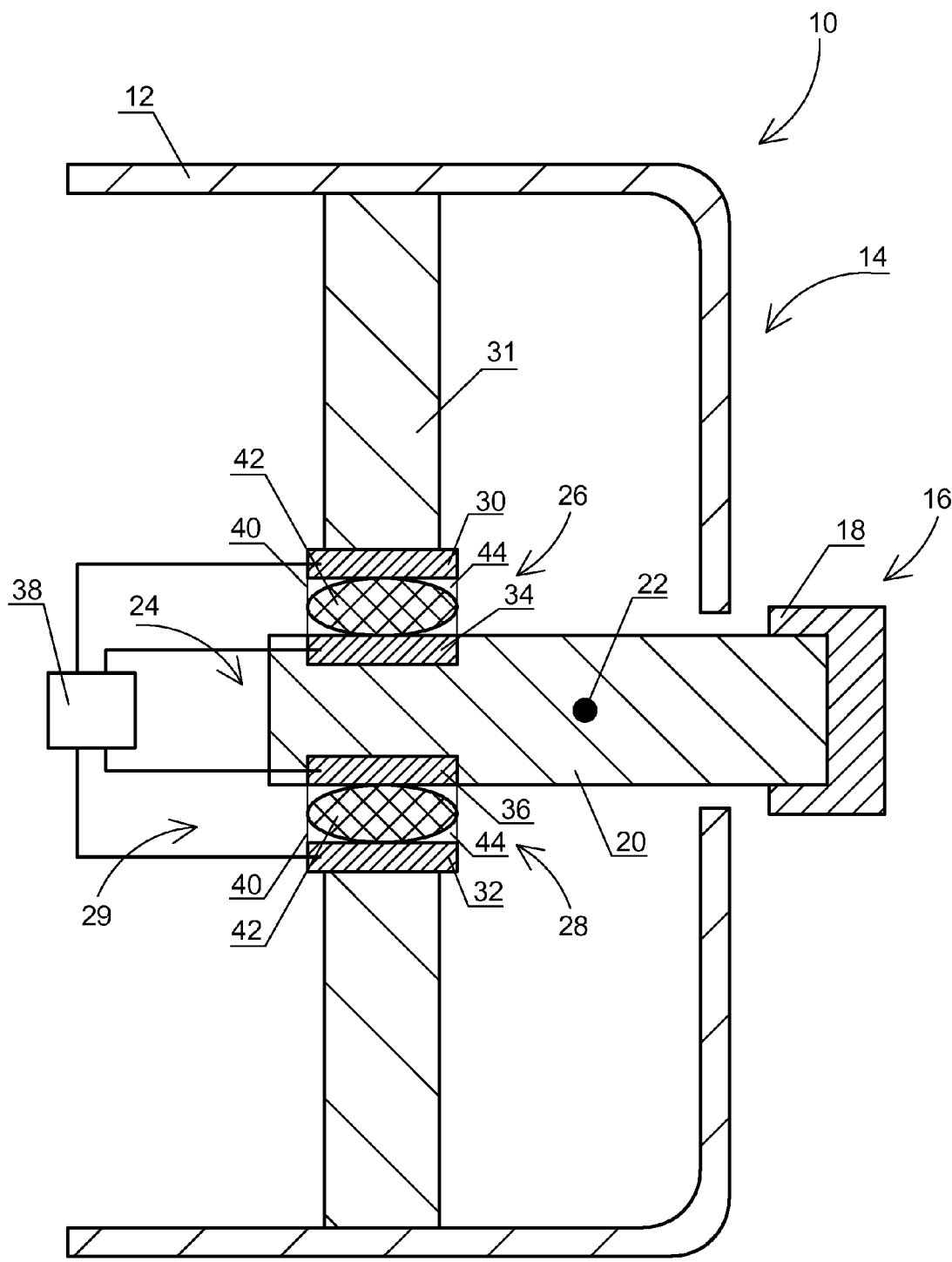
FIG. 1 is a cross sectional view of a part of a vehicle operating unit comprising a balcony-type (toggle) key whose actuation is detected by a capacitive sensor device.

In FIG. 1, there is illustrated, in cross sectional view and in largely simplified representation, the part of a vehicle operating device 10 that is essential for the invention, said device comprising a toggle key whose actuation is capacitively detected. The vehicle operating device 10 comprises a housing 12, with the operating end 16 of an operating key 18 projecting beyond the front side 14 of the housing. The operating key 18 is arranged on a lever- and respectively plate-shaped holder 20 which is supported for rotation about a tilting axis 22 in housing 12. Above and below the rear end 24 of the holder 20 facing away from the operating key 18, a first and a second capacitor 26,28 are arranged. Each capacitor 26,28 comprises a fixed first electrode 30,32 and a movable second electrode 34,36. In the present exemplary embodiment, the two first electrodes 30,32 of the two capacitors 26,28 are arranged on the mutually opposite edge portions of a recess 29 in a support body 31, with the end 24 of the holder 20 of operating key 18 being immersed into the recess 29. The two second electrodes 34,36 are arranged on opposite sides of the lever- and respectively plate-shaped holder 20, i.e. on the upper and lower sides of the latter. Thus, each of the first electrodes 30 and respectively 32 has a second electrode 34,36 arranged opposite to it. When the operating key 18 is tilted, the distances of the second electrodes 34,36 from their associated first electrodes 30 and respectively 32 of the two capacitors 26,28 will change in opposite senses. By these changes of the distances of the electrodes (in this exemplary embodiment, in mutually opposite directions, i.e. in opposite senses), the capacitance of each capacitor 26,28 will change, which, by use of an evaluation unit 38, will be detected with the aid of measurement technology and will be evaluated. Thereby, it is thus possible to detect an actuation of operating key 18.

As schematically shown in FIG. 1, the two electrode pairs of the capacitors 26,28 define a respective volume 40 between them. In the starting position of operating key 18 according to FIG. 1, the volume 40 is partially filled by a first dielectric 42. In the present exemplary embodiment, the first dielectric 42 has the shape of a lens. The first dielectric 42 is made of a non-gaseous material which in the present exemplary embodiment is an elastomer or rubber. Thus, in the present exemplary embodiment, the first dielectric 42 is resilient. Due to said lens shape, the first dielectric 42 is not in full-faced abutment on the respective electrodes 30 to 36; instead, a gas volume 44 comprising a plurality of partial volumes is formed between the first dielectric 42 and the appertaining electrodes. Said partial volumes have been filled with air when the operating key 18 is in its starting position.

Now, when the operating key 18 is actuated, said holder 20 will be pivoted, with the result that the electrode distance of one capacitor will be reduced and the electrode distance of the other capacitor will be enlarged. In case of a reduction of the electrode distance, air will be pressed out of the gas volumes 44 and finally will be "replaced" by material of the dielectric 42. Thus, the portion of air between the electrodes of said capacitor will decrease, which will lead to an increase of the change of capacitance, making it possible to detect movements of the operating key 18 with improved reliability and larger signal variations. Contributing to this is also the fact that the relative dielectric constant of the dielectric 42 is considerably higher than the relative dielectric constant of air existing in the gas volumes 44.

A constructive realization of the arrangement according to FIG. 1 can consist e.g. of a vertically disposed circuit board (cf. support body 31) formed with a longitudinal hole (cf. recess 29) having a through-contact in it. This throughgoing hole contact is then severed at two opposite ends, thereby generating the two electrodes 30,32. In the longitudinal hole (cf. recess 29), a further electrode (consisting of said electrodes 34 and 36) is centrally arranged. Now, in case that this electrode which is immersed into the longitudinal hole will move toward any one of the two electrodes 30,32, the electric capacitance between the respective electrodes will increase while decreasing between the respective other electrodes. For enhancing the to-be-measured capacitance and achieving a force-displacement correlation, an elastic dielectric 42 (e.g. rubber) is inserted between the electrodes. For increasing the change of capacitance depending on the displacement, the dielectric 42 has e.g. a profiled shape so that, when a deformation occurs under the effect of force application, this will cause a decrease of the portion of the air existing between the electrodes due to said profiled shape. Thus, the ratio between that portion of the volume between the electrodes that is occupied by the first dielectric 42 and the portion occupied by air will change when the distance between the electrodes is changing. Since rubber and respectively the first dielectric has a considerably larger relative dielectric constant than air, the change of capacitance in case of a change of distance between the electrodes will thus be stronger than if the dielectric between the differently spaced electrodes were always the same. Thus, there is achieved an easily detectable change of capacity which is also reliable.

Figure 2:
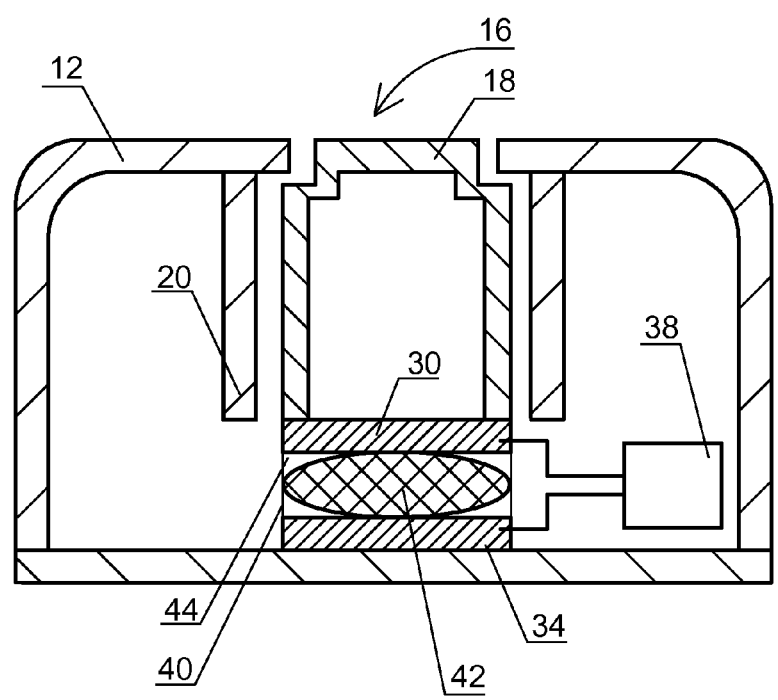
FIG. 2 is a partial sectional view of a vehicle operating unit according to a further exemplary embodiment, comprising a push button and a capacitive sensor device for detecting the actuation of the push button.

FIG. 2 shows an alternative exemplary embodiment wherein the capacitive sensor device of the invention is applied in case where the operating key is designed as a push key. In as far as the elements according to FIG. 1 correspond to those in FIG. 2 (i.e. are constructionally identical or functionally similar), they are marked in FIG. 2 by the same reference numerals as in FIG. 1. Thus, as in the exemplary embodiment according to FIG. 1, also the resilient first dielelectric 42 according to FIG. 2 can be used for automatic reset of the operating key 18 after the key has been actuated and the application of force onto the key has been terminated.

LIST OF REFERENCE NUMERALS 10 vehicle operating unit
12 housing of vehicle operating unit
14 front side of housing
16 operating end of an operating key
18 operating key
20 holder for operating key
22 tilt axis of holder/of operating key
24 end of holder with capacitors
26 first capacitor
28 second capacitor
29 recess on support body
30 first electrode of first capacitor
31 support body for first electrode of the two capacitors
32 first electrode of second capacitor
34 second electrode of first capacitor
36 second electrode of second capacitor
38 evaluation unit
40 volume between electrodes of a capacitor
42 dielectric between electrodes of a capacitor
44 gas volume between electrodes of a capacitor

What is claimed is:

1. A capacitive sensor for detecting the movement of an object, the capacitive sensor comprising:
   a first electrode,
   a second electrode provided for connection or mechanical coupling to, or for arrangement on, the object, whereby the distance of the second electrode from the first electrode changes when the object moves,
   the two electrodes forming a first capacitor with a volume between the electrodes, the size of the volume changing when the distance between the first and second electrodes changes, and
   an evaluation unit connected to the two electrodes and operative to determine a change of capacitance between the two electrodes resulting from a change of their spacing and the volume,
   wherein the volume includes a first part occupied by a deformable, non-gaseous first dielectric arranged between the two electrodes, and a second part filled with a gaseous second dielectric,
   wherein the first dielectric is a shaped body made of a deformable material, the shaped body having two outer sides respectively facing toward the electrodes, the two outer sides defining a thickness of the first dielectric that decreases from a center of the first dielectric to an outer periphery of the first dielectric, and at least one of the outer sides defining with the respective electrode a first portion of the gas-filled second part of the volume,
   wherein the first portion decreases in size when the electrodes approach one another so that at least a part of the gaseous second dielectric is caused to escape from the first portion of the gas-filled second part of the volume, and,
   wherein when the two electrodes approach one another, the first dielectric occupies a greater percentage of the volume between the electrodes and the gaseous second dielectric-occupies smaller percentage of the volume between electrodes; and
   wherein the shaped body has the shape of a lens with at least one of the two outer sides being convex in shape for contacting the respective electrode at a progressively increasing contact area as the shaped body deforms when the spacing between the electrodes is decreased.

2. The capacitive sensor according to claim 1, wherein the first dielectric comprises an open-celled material.

3. The capacitive sensor according to claim 1, wherein the first portion of the gas-filled second part of the volume is formed by a recess in the first dielectric that is open toward an exterior of the volume between the electrodes.

4. The capacitive sensor according to claim 1, wherein the first dielectric is resilient.

5. The capacitive sensor according to claim 1, wherein the first dielectric is an elastomer.

6. The capacitive sensor according to claim 1, wherein the first dielectric has a larger dielectric constant than the gaseous second dielectric.

7. The capacitive sensor according to claim 1, comprising a second capacitor which comprises a first electrode and a second electrode provided for connection or mechanical coupling to, or for arrangement on, the object, wherein, in case of a movement of the object, the distances between the electrodes of the two capacitors will change in opposite senses, wherein both capacitors comprise between them a non-gaseous first and a gaseous second dielectric, and wherein the electrodes of both capacitors are connected to the evaluation unit.

8. The capacitive sensor of claim 1, wherein both of the two outer sides are convex in shape.

9. The capacitive sensor of claim 1, wherein the elastomer is rubber.

* * * * *